[19] United States Patent
Chang

(10) Patent No.: US 8,996,933 B2
(45) Date of Patent: Mar. 31, 2015

(54) MEMORY MANAGEMENT METHOD, CONTROLLER, AND STORAGE SYSTEM

(75) Inventor: Ching-Wen Chang, Hsinchu (TW)

(73) Assignee: Phison Eletronics Corp., Miaoli (TW)

( * ) Notice: Subject to any disclaimer, the term of this patent is extended or adjusted under 35 U.S.C. 154(b) by 310 days.

(21) Appl. No.: 12/886,578

(22) Filed: Sep. 21, 2010

(65) Prior Publication Data
US 2012/0036369 A1 Feb. 9, 2012

(30) Foreign Application Priority Data

Aug. 6, 2010 (TW) .............................. 99126257 A

(51) Int. Cl.
G11C 29/00 (2006.01)
G11C 16/22 (2006.01)
G11C 7/24 (2006.01)
G11C 29/44 (2006.01)

(52) U.S. Cl.
CPC ........ *G11C 16/22* (2013.01); *G11C 7/24* (2013.01); G11C 2029/4402 (2013.01)
USPC .......................................................... 714/718

(58) Field of Classification Search
USPC .......................................................... 713/189
See application file for complete search history.

(56) References Cited

U.S. PATENT DOCUMENTS

| 5,757,919 | A  | * | 5/1998  | Herbert et al. ............... 713/187 |
| 6,026,293 | A  | * | 2/2000  | Osborn ........................ 711/164 |
| 6,188,619 | B1 | * | 2/2001  | Jung ............................. 365/200 |
| 6,501,173 | B2 | * | 12/2002 | Nishizawa et al. ........... 257/723 |
| 6,782,458 | B1 | * | 8/2004  | Noble ........................... 711/163 |
| 7,313,704 | B2 | * | 12/2007 | Kashiwada .................. 713/191 |
| 7,434,122 | B2 | * | 10/2008 | Jo ................................. 714/723 |
| 7,690,031 | B2 | * | 3/2010  | Ma et al. ........................... 726/9 |
| 2006/0031710 | A1 |   | 2/2006  | Jo |
| 2007/0283428 | A1 |   | 12/2007 | Ma et al. |
| 2008/0107275 | A1 | * | 5/2008  | Asnaashari .................. 380/281 |

FOREIGN PATENT DOCUMENTS

CN 1716450 1/2006

* cited by examiner

*Primary Examiner* — Jeffrey R Swearingen
(74) *Attorney, Agent, or Firm* — Jianq Chyun IP Office

(57) ABSTRACT

An identification code generation method and a management method for a non-volatile memory, and a controller and a storage system using the same are provided, and the non-volatile memory has a plurality of physical blocks. The identification code generation method includes testing the physical blocks to obtain an availability state of the physical blocks and identifying a plurality of good physical blocks or bad physical blocks among the physical blocks according to the availability state. The identification code generation method also includes generating a memory identification code corresponding to the non-volatile memory according to the good physical blocks or the bad physical blocks. Thereby, in the present invention, a unique memory identification code is generated and is prevented from being stolen.

16 Claims, 11 Drawing Sheets

MEMORY MANAGEMENT METHOD, CONTROLLER, AND STORAGE SYSTEM

CROSS-REFERENCE TO RELATED APPLICATION

This application claims the priority benefit of Taiwan application serial no. 99126257, filed on Aug. 6, 2010. The entirety of the above-mentioned patent application is hereby incorporated by reference herein and made a part of this specification.

BACKGROUND

1. Technology Field

The present invention generally relates to an identification code generation method and a management method for a memory, and more particularly, to an identification code generation method and a management method for a non-volatile memory and a memory controller and a memory storage system using the same.

2. Description of Related Art

Along with the widespread of digital cameras, cell phones, and MP3 in recently years, the consumers' demand to storage media has increased drastically. Non-volatile memory is one of the most adaptable memories for such battery-powered portable products due to its characteristics such as data non-volatility, low power consumption, small volume, and non-mechanical structure. A memory card is a storage device which uses a NAND flash memory as its storage medium.

Even though non-volatile memory has aforementioned advantages, how to prevent unauthorized distribution of a digital content when the digital content is transmitted by using a non-volatile memory storage medium is a major subject to the publisher of the digital content. For example, a digital music supplier encrypts the digital content stored in a non-volatile memory module by using a memory identification code of the non-volatile memory module so as to prevent the digital content from being distributed to other storage media. However, the digital content stored in the non-volatile memory module can be easily stolen. Namely, a hacker can obtain the memory identification code by analyzing the digital content stored in the non-volatile memory module and then crack the encrypted digital content.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to an identification code generation method, wherein a unique memory identification code is generated according to the characteristic of a non-volatile memory module and is prevented from being stolen.

The present invention is directed to a memory management method, and a memory controller and a memory storage system using the same, wherein a non-volatile memory is identified according to a unique memory identification code of a non-volatile memory module so that the non-volatile memory is prevented from being replaced.

The present invention is directed to a memory management method that can prevent digital data stored in a non-volatile memory module from being misappropriated.

According to an exemplary embodiment of the present invention, an identification code generation method for generating a memory identification code corresponding to a non-volatile memory module is provided, wherein the non-volatile memory module has a plurality of physical blocks. The identification code generation method includes testing the physical blocks to obtain an availability state of the physical blocks and identifying good physical blocks among the physical blocks according to the availability state. The identification code generation method also includes generating the memory identification code corresponding to the non-volatile memory module according to the good physical blocks.

According to an exemplary embodiment of the present invention, an identification code generation method for generating a memory identification code corresponding to the non-volatile memory module is provided, wherein the non-volatile memory module has a plurality of physical blocks. The identification code generation method includes testing the physical blocks to obtain an availability state of the physical blocks and identifying bad physical blocks among the physical blocks according to the availability state. The identification code generation method also includes generating the memory identification code corresponding to the non-volatile memory module according to bad physical pages of the bad physical blocks, wherein each of the bad physical blocks has one or more bad physical pages.

According to an exemplary embodiment of the present invention, a memory management method for a non-volatile memory module is provided, wherein the non-volatile memory module has a plurality of physical blocks and stores a memory identification code signature. The memory management method includes checking an availability state of the physical blocks and generating a memory identification code corresponding to the non-volatile memory module according to the availability state of the physical blocks. The memory management method also includes generating a comparison code according to the memory identification code by using a one-way hash function, reading the memory identification code signature from the non-volatile memory module, and determining whether the comparison code is the same as the memory identification code signature. The memory management method further includes terminating any operation to be performed on the non-volatile memory module when the comparison code is not the same as the memory identification code signature.

According to an exemplary embodiment of the present invention, a memory storage system including a connector, a non-volatile memory module having a plurality of physical blocks, and a memory controller is provided. The connector is used for coupling to a host system. The memory controller is coupled to the connector and the non-volatile memory module. The memory controller executes the identification code generation method and the memory management method described above.

According to an exemplary embodiment of the present invention, a memory controller for managing a non-volatile memory module is provided. The memory controller includes a host interface, a memory interface, a read-only memory (ROM), and a memory management circuit. The host interface is used for coupling to a host system. The memory interface is used for coupling to the non-volatile memory module. The ROM stores a controller identification code. The memory management circuit is coupled to the host interface, the memory interface, and the ROM. The memory management circuit encrypts a writing data by using the controller identification code as an encryption key and writes the encrypted writing data into the non-volatile memory module. The memory management circuit also reads a reading data from the non-volatile memory module and decrypts the reading data by using the controller identification code as a decryption key.

As described above, exemplary embodiments of the present invention provide an identification code generation method, a memory management method, and a memory controller and a memory storage system using the methods, wherein a memory identification code is generated according to the characteristic of a non-volatile memory module and is prevented from being stolen.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
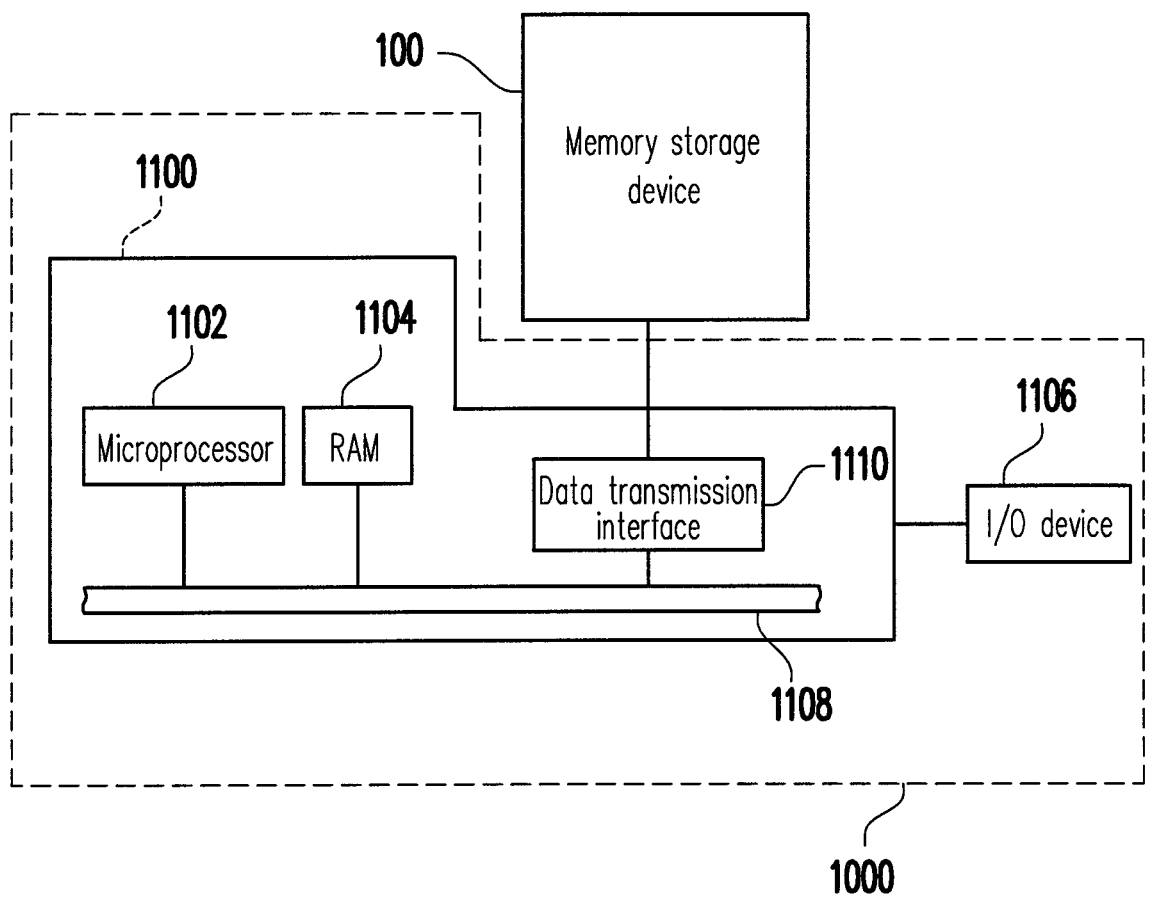
FIG. 1A is a diagram illustrating a host system and a memory storage device according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Exemplary Embodiment

Generally speaking, a memory storage device (also referred to as a memory storage system) includes a non-volatile memory module and a controller (also referred to as a control circuit). The memory storage device is usually used together with a host system so that the host system can write data into or read data from the memory storage device.

FIG. 1A is a diagram illustrating a host system and a memory storage device according to the first exemplary embodiment of the present invention.

Figure 1B:
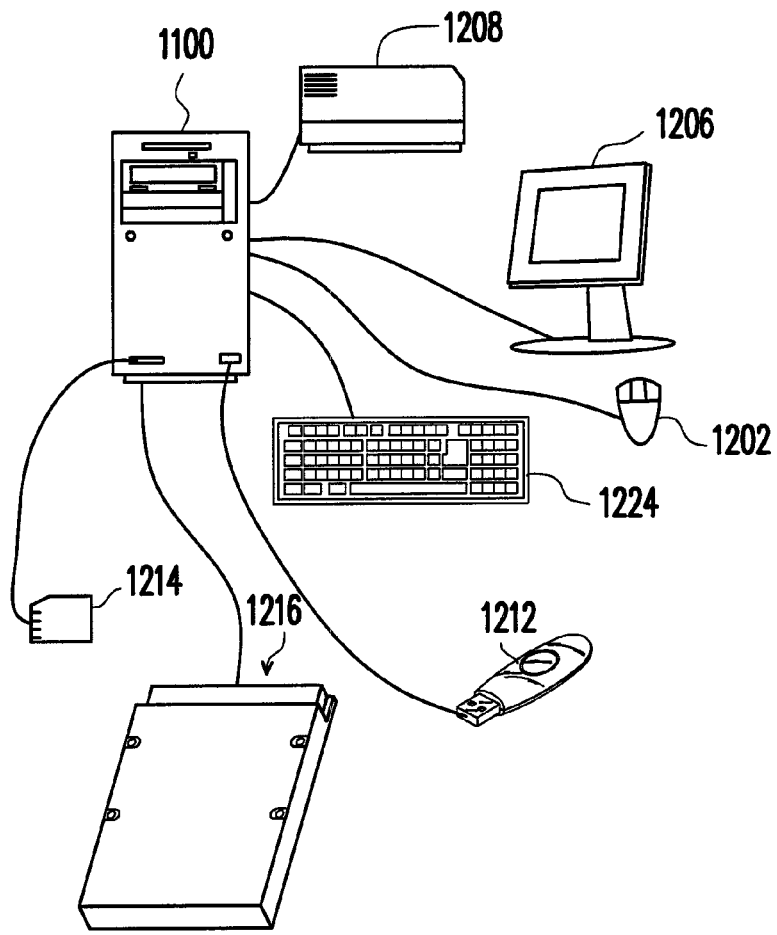
FIG. 1B is a diagram illustrating a computer, an input/output (I/O) device, and a memory storage device according to an exemplary embodiment of the present invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes the mouse 1202, the keyboard 1224, the display 1206, and the printer 1208 illustrated in FIG. 1B. It should be understood that the I/O device 1106 is not limited to the devices illustrated in FIG. 1B, and which may further include other devices.

In the present exemplary embodiment, the memory storage device 100 is coupled to other devices of the host system 1000 through the data transmission interface 1110. Through the operation of the microprocessor 1102, the RAM 1104, and the I/O device 1106, data can be written into the memory storage device 100 or read from the same. For example, the memory storage device 100 may be a non-volatile memory storage device, such as the flash drive 1212, the memory card 1214, or the solid state drive (SSD) 1216 illustrated in FIG. 1B.

Figure 1C:
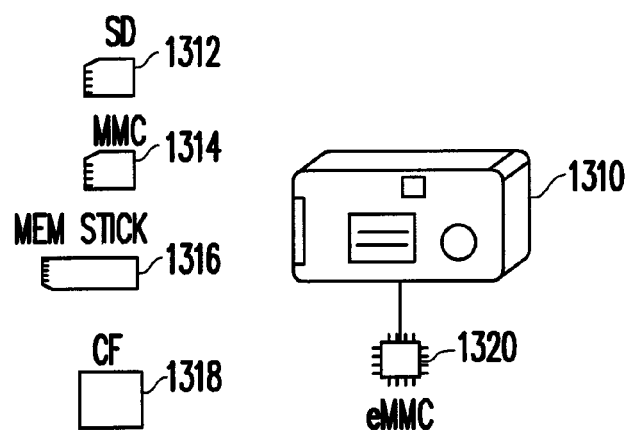
FIG. 1C is a diagram illustrating a host system and a memory storage device according to another exemplary embodiment of the present invention.

Generally speaking, the host system 1000 can be substantially any system that can store data. Even though the host system 1000 is described as a computer system in the present exemplary embodiment, in another exemplary embodiment of the present invention, the host system 1000 may also be a digital camera, a video camera, a communication device, an audio player, or a video player. For example, if the host system is a digital camera (video camera) 1310, the non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used with the digital camera (video camera) 1310. The embedded storage device 1320 may be an embedded MMC (eMMC). It should be mentioned that the eMMC is directly coupled to the substrate of the host system.

Figure 2:
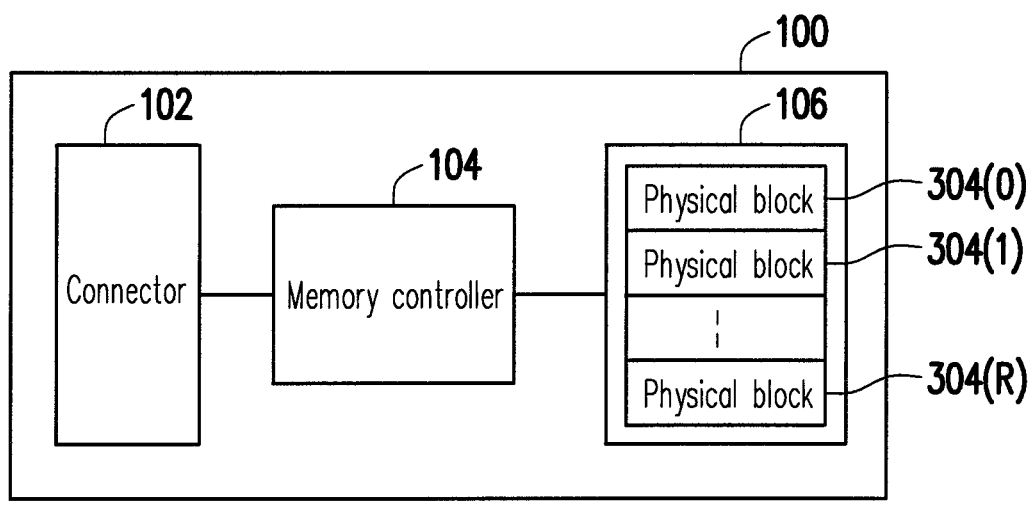
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connector 102, a memory controller 104, and a non-volatile memory module 106.

In the present exemplary embodiment, the connector 102 is a universal serial bus (USB) connector. However, the present invention is not limited thereto, and the connector 102 may also be an Institute of Electrical and Electronic Engineers (IEEE) 1394 connector, a peripheral component interconnect (PCI) express connector, a serial advanced technology attachment (SATA) connector, a SD interface connector, a MS interface connector, a MMC interface connector, a CF interface connector, an integrated device electronics (IDE) connector, or other suitable connectors.

The memory controller 104 executes a plurality of logic gates or control instructions implemented in a hardware form or a firmware form and performs various data operations (writing, reading, and erasing, etc) in the non-volatile memory module 106 according to instructions of the host system 1000. In the present exemplary embodiment, the memory controller 104 checks the availability state of the physical blocks 304(0)-304(R) of the non-volatile memory module 106 and generates a memory identification code corresponding to the non-volatile memory module 106 according to the availability state. In particular, the memory controller 104 identifies the non-volatile memory module 106 according to the memory identification code so as to access and manage the non-volatile memory module 106. Below, the identification code generation method, the data access method, and the memory management method in the first exemplary embodiment of the present invention will be described in detail with reference to accompanying drawings.

The non-volatile memory module 106 is coupled to the memory controller 104 and configured to store data written by the host system 1000. The non-volatile memory module 106 includes the physical blocks 304(0)-304(R). Each of the physical blocks has a plurality of physical pages. The physical pages belonging to the same physical block can be respectively written but have to be erased simultaneously. To be specific, each physical block is the smallest erasing unit. Namely, each physical block contains the least number of memory cells that are erased together. Each physical page is the smallest programming unit. Namely, each physical page is the smallest unit for writing data. However, it should be understood that in another exemplary embodiment of the present invention, the smallest unit for writing data may also be sector or other units. In addition, the physical blocks 304(0)-304(R) are logically grouped into a data area, a spare area, a system area, and a replacement area. The physical blocks in the data area and the spare area are alternatively used for storing data written by the host system 1000, the physical blocks in the system area are used for storing system data of the memory storage device 100, and the physical blocks in the replacement area are used for replacing bad physical blocks in the data area, the spare area, and the system area.

In the present exemplary embodiment, the non-volatile memory module 106 is a rewritable non-volatile memory module. For example, the non-volatile memory module 106 is a multi level cell (MLC) NAND flash memory module. However, the present invention is not limited thereto, and the non-volatile memory module 106 may also be a single level cell (SLC) NAND flash memory module, other types of flash memory modules, or other memory modules having the same characteristics.

Figure 3:
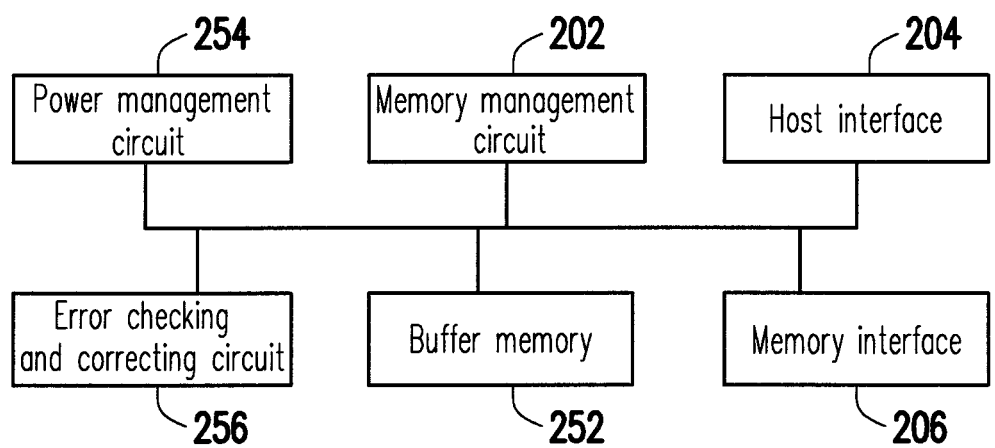
FIG. 3 is a schematic block diagram of a memory controller according to an exemplary embodiment of the present invention.

FIG. 3 is a schematic block diagram of a memory controller according to an exemplary embodiment of the present invention.

Referring to FIG. 3, the memory controller 104 includes a memory management circuit 202, a host interface 204, and a memory interface 206.

The memory management circuit 202 controls the operation of the memory controller 104. To be specific, the memory management circuit 202 has a plurality of control instructions. When the memory storage device 100 is in operation, the memory management circuit 202 executes the control instructions to manage the non-volatile memory module 106 through the identification code generation method, the data assess method, and the memory management method according to the present exemplary embodiment.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage device 100 is in operation, the control instructions are executed by the microprocessor unit so that the identification code generation method, the data assess method, and the memory management method in the first exemplary embodiment of the present invention are accomplished.

In another exemplary embodiment of the present invention, the control instructions of the memory management circuit 202 may also be stored in a specific area (for example, the system area in a memory module exclusively used for storing system data) of the non-volatile memory module 106 as program codes. The memory management circuit 202 may also have a microprocessor unit (not shown), a ROM (not shown), and a random access memory (RAM, not shown). In particular, the ROM has a driving code, and when the memory controller 104 is enabled, the microprocessor unit first executes the driving code to load the control instructions from the non-volatile memory module 106 into the RAM of the memory management circuit 202. After that, the microprocessor unit runs the control instructions to execute the identification code generation method, the data assess method, and the memory management method according to the first exemplary embodiment of the present invention. In another exemplary embodiment of the present invention, the control instructions of the memory management circuit 202 may also be implemented in a hardware form.

The host interface 204 is coupled to the memory management circuit 202 and configured to receive and identify instructions and data received from the host system 1000. Namely, instructions and data output by the host system 1000 are transmitted to the memory management circuit 202 through the host interface 204. In the present exemplary embodiment, the host interface 204 is a USB interface in accordance with the connector 102. However, the present invention is not limited thereto, and the host interface 204 may also be a PATA interface, an IEEE 1394 interface, a PCI express interface, a SATA interface, a SD interface, a MS interface, a MMC interface, a CF interface, an IDE interface, or other suitable data transmission interfaces.

The memory interface 206 is coupled to the memory management circuit 202 and configured to access the non-volatile memory module 106. Namely, data to be written into the non-volatile memory module 106 is converted by the memory interface 206 into a format acceptable to the non-volatile memory module 106.

In an exemplary embodiment of the present invention, the memory controller 104 further includes a buffer memory 252. The buffer memory 252 is coupled to the memory management circuit 202 and used for temporarily storing data and instructions received from the host system 1000 or data received from the non-volatile memory module 106.

In an exemplary embodiment of the present invention, the memory controller 104 further includes a power management circuit 254. The power management circuit 254 is coupled to the memory management circuit 202 and used for controlling the power supply of the memory storage device 100.

In an exemplary embodiment of the present invention, the memory controller 104 further includes an error checking and correcting circuit 256. The error checking and correcting circuit 256 is coupled to the memory management circuit 202 and configured to execute an error checking and correcting procedure to ensure the accuracy of the data. To be specific, when the memory management circuit 202 receives a write command from the host system 1000, the error checking and correcting circuit 256 generates an error checking and correcting (ECC) code for the data corresponding to the write command, and the memory management circuit 202 writes the data corresponding to the write command and the corresponding ECC code into the non-volatile memory module 106. Subsequently, when the memory management circuit 202 reads the data from the non-volatile memory module 106, it also reads the ECC code corresponding to the data, and the error checking and correcting circuit 256 executes the error checking and correcting procedure on the data according to the ECC code.

Figure 4:
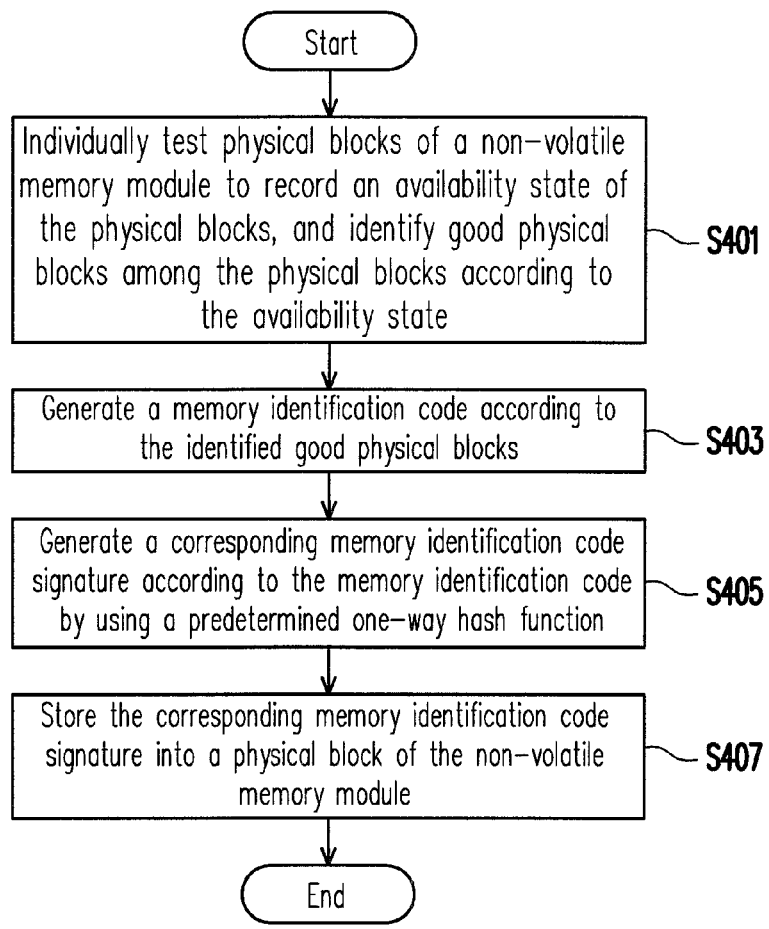
FIG. 4 is a flowchart of an identification code generation method according to the first exemplary embodiment of the present invention.

FIG. 4 is a flowchart of an identification code generation method according to the first exemplary embodiment of the present invention.

Referring to FIG. 4, in step S401, the memory management circuit 202 individually tests the physical blocks 304(0)-304(R) to record the availability state of the physical blocks 304(0)-304(R), and the memory management circuit 202 identifies good physical blocks among the physical blocks 304(0)-304(R) according to the availability state. In step S403, the memory management circuit 202 generates a memory identification code according to the identified good physical blocks.

Figure 5:
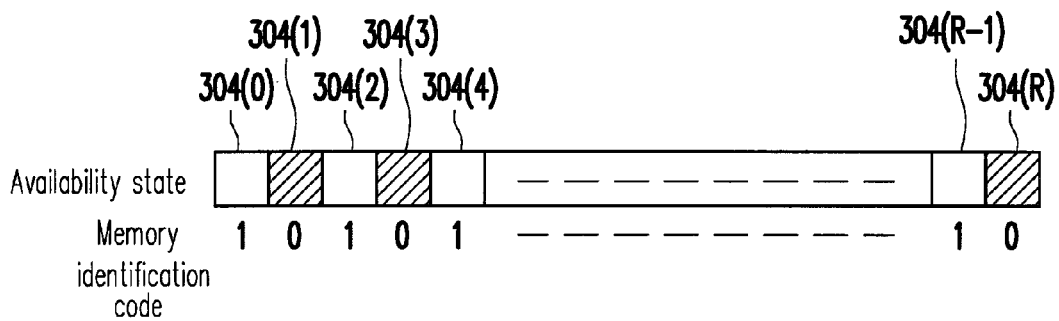
FIG. 5 is a diagram illustrating an example of a memory identification code according to the first exemplary embodiment of the present invention.

FIG. 5 is a diagram illustrating an example of a memory identification code according to the first exemplary embodiment of the present invention.

Referring to FIG. 5, it is assumed that the physical blocks 304(0), 304(2), and 304(4)-304(R-1) are good physical blocks while the rest physical blocks are bad physical blocks (as indicated by the diagonal lines) among the physical blocks 304(0)-304(R). Thus, after sequentially performing a read operation on the physical blocks 304(0)-304(R), the memory management circuit 202 generates a R-bit memory identification code according to the results of the read operations, wherein the bits corresponding to the good physical blocks are marked as "1", while the bits corresponding to other physical blocks are marked as "0". Since a damaged physical block (i.e., a bad physical block) cannot be restored back into a good physical block, the memory identification code can be served as a unique fingerprint of the non-volatile memory module 106.

However, the present invention is not limited to the example illustrated in FIG. 5, and any other memory identification code generated according to the good physical blocks can be applied in the present invention. For example, the bits corresponding to the good physical blocks may be marked as "0" while the bits corresponding to the rest physical blocks may be marked as "1", or the good physical blocks may also be marked with other symbols.

Referring to FIG. 4 again, in step S405, the memory management circuit 202 generates a corresponding memory identification code signature according to the memory identification code by using a predetermined one-way hash function. In the present exemplary embodiment, the one-way hash function is implemented with a SHA-256 function. However, the present invention is not limited thereto, and in another exemplary embodiment of the present invention, the one-way hash function may also be implemented with a MD5 function, a RIPEMD-160 SHA1 function, a SHA-386 function, a SHA-512 function, or other suitable functions.

It should be mentioned that in the present exemplary embodiment, the memory management circuit 202 generates the memory identification code signature by using the memory identification code as an input parameter of the one-way hash function. However, in another exemplary embodiment of the present invention, the memory management circuit 202 generates the memory identification code signature by using the memory identification code and a controller identification code of the memory controller 104 as the input parameters of the one-way hash function. Herein the controller identification code is a serial number of a random number assigned by the manufacturer of the memory controller 104. The controller identification code may be recorded in the memory management circuit 202 or in a ROM (not shown) of the memory controller 104.

Thereafter, in step S407, the memory management circuit 202 stores the corresponding memory identification code signature into a physical block of the non-volatile memory module 106. For example, the memory management circuit 202 stores the memory identification code signature corresponding to the non-volatile memory module 106 into a physical block in the system area. In particular, the memory management circuit 202 stores the encoded memory identification code signature instead of the original memory identification code signature into the non-volatile memory module 106 such that the memory identification code is protected from any hacker.

It should be mentioned that the memory management circuit 202 initially executes the identification code generation method to generate the memory identification code of the non-volatile memory module 106 and stores the memory identification code signature before the memory storage device 100 is released. Particularly, good physical blocks gradually turn into bad physical blocks after being written and erased repeatedly in the course of the operation of the non-volatile memory module 106. Accordingly, once a new bad physical block is detected during the operation of the memory storage device 100, the memory management circuit 202 executes the identification code generation method again to re-generate a memory identification code for the non-volatile memory module 106 and the store the memory identification code signature again.

In the present exemplary embodiment, every time when the memory storage device 100 is powered on, the memory management circuit 202 checks the availability state of the physical blocks in the non-volatile memory module coupled thereto to obtain the memory identification code and authenticates the non-volatile memory module according to the memory identification code.

Figure 6:
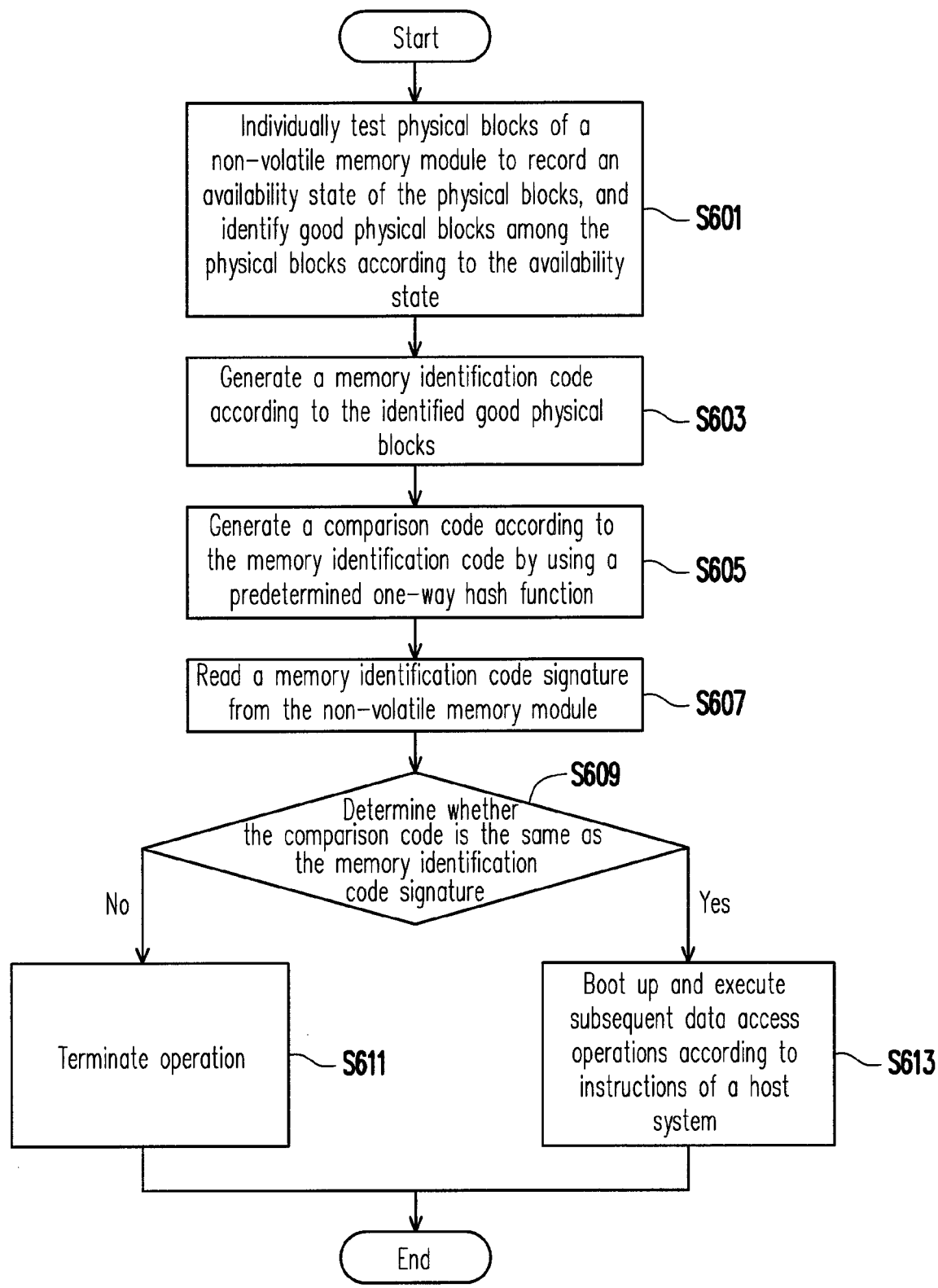
FIG. 6 is a flowchart of a memory management method according to the first exemplary embodiment of the present invention.

FIG. 6 is a flowchart of a memory management method according to the first exemplary embodiment of the present invention.

Referring to FIG. 6, in step S601, the memory management circuit 202 individually tests the physical blocks 304(0)-304(R) to record the availability state of the physical blocks 304(0)-304(R) and identifies good physical blocks among the physical blocks 304(0)-304(R) according to the availability state. In step S603, the memory management circuit 202 generates a memory identification code according to the identified good physical blocks. The method for generating the memory identification code has been described above with reference to FIG. 5 therefore will not be described herein.

Then, in step S605, the memory management circuit 202 generates a comparison code according to the memory identification code by using a predetermined one-way hash function. After that, in step S607, the memory management circuit 202 reads a memory identification code signature from the non-volatile memory module 106. In step S609, the memory management circuit 202 determines whether the comparison code is the same as the memory identification code signature.

If the comparison code is different from the memory identification code signature, in step S611, the memory management circuit 202 terminates its operation. For example, in step S611, the memory management circuit 202 sends an error message to the host system 1000 and does not execute any instruction received from the host system 1000.

If the comparison code is the same as the memory identification code signature, in step S613, the memory management circuit 202 starts up and executes subsequent data access operations according to instructions of the host system 1000. For example, the memory management circuit 202 writes data according to a write command of the host system 1000 or reads data according to a read command of the host system 1000.

It should be mentioned that in the present exemplary embodiment, the good physical blocks are determined by individually testing the physical blocks 304(0)-304(R) and recording the availability state of the physical blocks 304(0)-304(R). However, the present invention is not limited thereto, and in another exemplary embodiment of the present invention, the same purpose may be accomplished by only testing a part of the physical blocks. For example, in another exemplary embodiment of the present invention, bad physical blocks are recorded in a physical block management table so that the physical blocks can be managed conveniently. To be specific, the physical block management table records bad physical blocks in the non-volatile memory module 106, and the memory management circuit 202 avoids using any bad physical block by maintaining the physical block management table. Accordingly, the memory management circuit 202 only tests those physical blocks that are not marked as bad physical blocks in the physical block management table so as to shorten the testing time.

Additionally, in another exemplary embodiment of the present invention, while executing a write command or a read command, the memory management circuit 202 may further encrypt or decrypt the data according to the memory identification code in order to protect the data to be stored. For example, when a write command is received from the host system 1000, the memory management circuit 202 uses the memory identification code as an encryption key to encrypt the data corresponding to the write command by using a predetermined encryption function and writes the encrypted data into the non-volatile memory module 106. On the other hand, when a read command is received from the host system 1000, the memory management circuit 202 reads the data corresponding to the read command from the non-volatile memory module 106 and uses the memory identification code as a decryption key to decrypt the data by using a predetermined decryption function corresponding to the predetermined encryption function.

Second Exemplary Embodiment

The memory storage device and the host system in the second exemplary embodiment of the present invention are substantially the same as those in the first exemplary embodiment, and the difference is that in the second exemplary embodiment, the memory controller generates the memory identification code through a different technique. Below, the second exemplary embodiment will be described with reference to FIG. 1A, FIG. 2, and FIG. 3.

Figure 7:
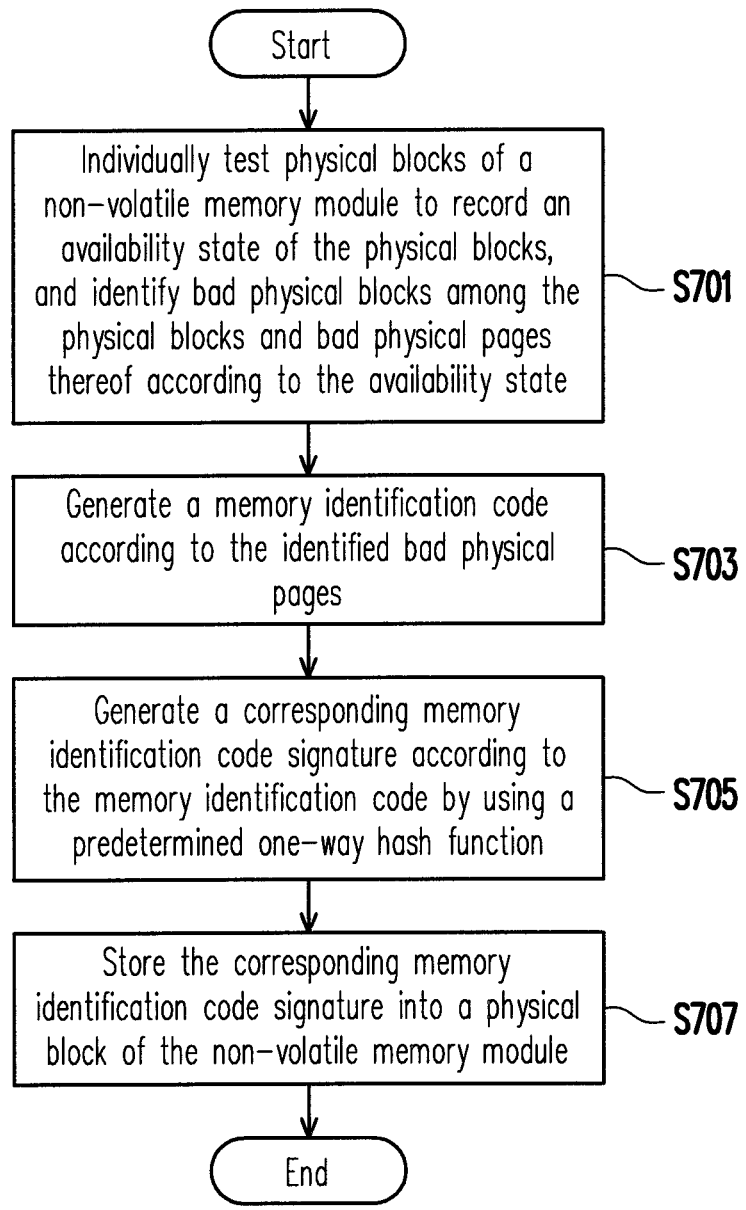
FIG. 7 is a flowchart of an identification code generation method according to a second exemplary embodiment of the present invention.

FIG. 7 is a flowchart of an identification code generation method according to the second exemplary embodiment of the present invention.

Referring to FIG. 7, in step S701, the memory management circuit 202 individually tests the physical blocks 304(0)-304(R) to record the availability state of the physical blocks 304(0)-304(R) and identifies bad physical blocks among the physical blocks 304(0)-304(R) and bad physical pages of the bad physical blocks according to the availability state. As described above, a physical block has a plurality of physical pages, and the memory management circuit 202 identifies the physical block as a bad physical block when at least one of the physical pages cannot be used for writing data.

Then, in step S703, the memory management circuit 202 generates a memory identification code according to the identified bad physical pages.

Figure 8:
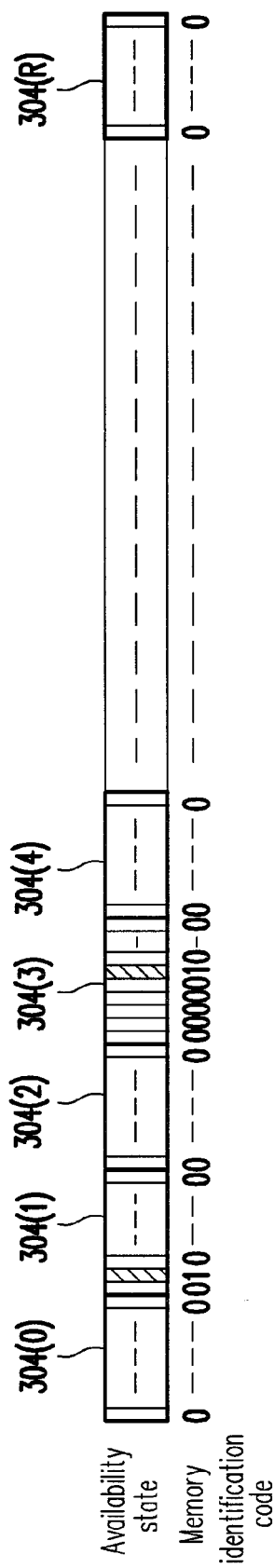
FIG. 8 is a diagram illustrating an example of a memory identification code according to the second exemplary embodiment of the present invention.

FIG. 8 is a diagram illustrating an example of a memory identification code according to the second exemplary embodiment of the present invention.

Referring to FIG. 8, it is assumed that each of the physical blocks 304(0)-304(R) has 256 physical pages and the physical block 304(1) and the physical block 304(3) respectively have a bad physical page (i.e., the $1^{st}$ physical page of the physical block 304(1) and the $5^{th}$ physical page of the physical block 304(3) as indicated by the diagonal lines). Thus, after sequentially performing data reading operations on the physical pages of the physical blocks 304(0)-304(R), the memory management circuit 202 generates a (256*R)-bit memory identification code according to the reading results, wherein the bits corresponding to the bad physical pages are marked as "1", while the bits corresponding to other physical pages are marked as "0". Since a damaged physical block (i.e., a bad physical block) cannot be restored back into a good physical block, the memory identification code can be served as a unique fingerprint of the non-volatile memory module 106.

It should be mentioned that even though in the example illustrated in FIG. 8, each bad physical block has one bad physical page, the present invention is not limited thereto. If each bad physical block has multiple bad physical pages, the memory management circuit 202 may generate the memory identification code according to all the bad physical pages in each bad physical block or accordingly to only a part of the bad physical pages in each bad physical block.

Figure 9:
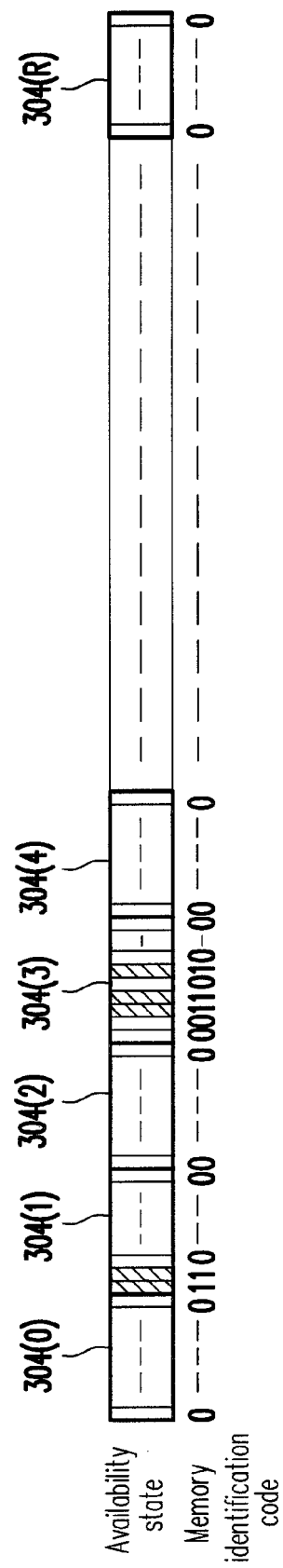
FIG. 9 is a diagram illustrating another example of a memory identification code according to the second exemplary embodiment of the present invention.

FIG. 9 is a diagram illustrating another example of a memory identification code according to the second exemplary embodiment of the present invention.

Referring to FIG. 9, it is assumed that each of the physical blocks 304(0)-304(R) has 256 physical pages, the physical block 304(1) has 2 bad physical pages, and the physical block 304(3) has 3 bad physical pages (i.e., the $0^{th}$ and the $1^{st}$ physical pages of the physical block 304(1) and the $2^{nd}$, the $3^{rd}$, and the $5^{th}$ physical pages of the physical block 304(3), as indicated by the diagonal lines). Thus, after sequentially performing data reading operations on the physical pages of the physical blocks 304(0)-304(R), the memory management circuit 202 generates a (256*R)-bit memory identification code according to the data reading results, wherein the bits corresponding to the bad physical pages are marked as "1", while the bits corresponding to the rest physical pages are marked as "0".

Figure 10:
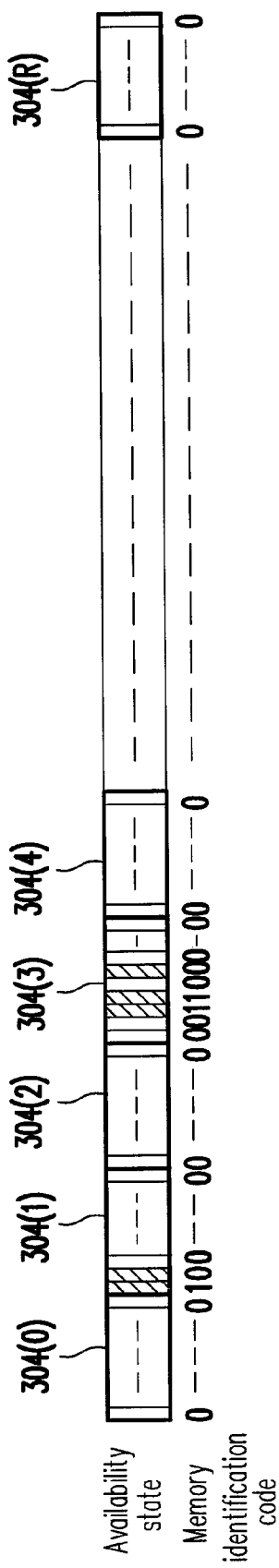
FIG. 10 is a diagram illustrating yet another example of a memory identification code according to the second exemplary embodiment of the present invention.

FIG. 10 is a diagram illustrating yet another example of a memory identification code according to the second exemplary embodiment of the present invention.

Referring to FIG. 10, it is assumed that each of the physical blocks 304(0)-304(R) has 256 physical pages, the physical block 304(1) has 2 bad physical pages, and the physical 304(3) has 3 bad physical pages (i.e., the $0^{th}$ and the $1^{st}$ physical pages of the physical block 304(1) and the $2^{nd}$, the $3^{rd}$, and the $5^{th}$ physical pages of the physical block 304(3), as indicated by the diagonal lines). Thus, after sequentially performing data reading operations on the physical pages of the physical blocks 304(0)-304(R), the memory management circuit 202 generates a (256*R)-bit memory identification code according to the data reading results, wherein the bits corresponding to a part of the bad physical pages in each bad physical block (for example, the $0^{th}$ physical page of the physical block 304(1) and the $2^{nd}$ and the $3^{rd}$ physical pages of the physical block 304(3)) are marked as "1", while the bits corresponding to the rest physical pages are marked as "0".

Referring to FIG. 7 again, in step S705, the memory management circuit 202 generates a corresponding memory identification code signature according to the memory identification code by using a predetermined one-way hash function.

Next, in step S707, the memory management circuit 202 stores the corresponding memory identification code signature into a physical block of the non-volatile memory module 106. For example, the memory management circuit 202 stores the memory identification code corresponding to the non-volatile memory module 106 into a physical block in the system area.

Similarly, in the second exemplary embodiment, every time when the memory storage device 100 is powered on, the memory management circuit 202 checks the availability state of the physical blocks in the non-volatile memory module coupled to the memory management circuit 202 to obtain the memory identification code and authenticates the non-volatile memory module according to the memory identification code.

Figure 11:
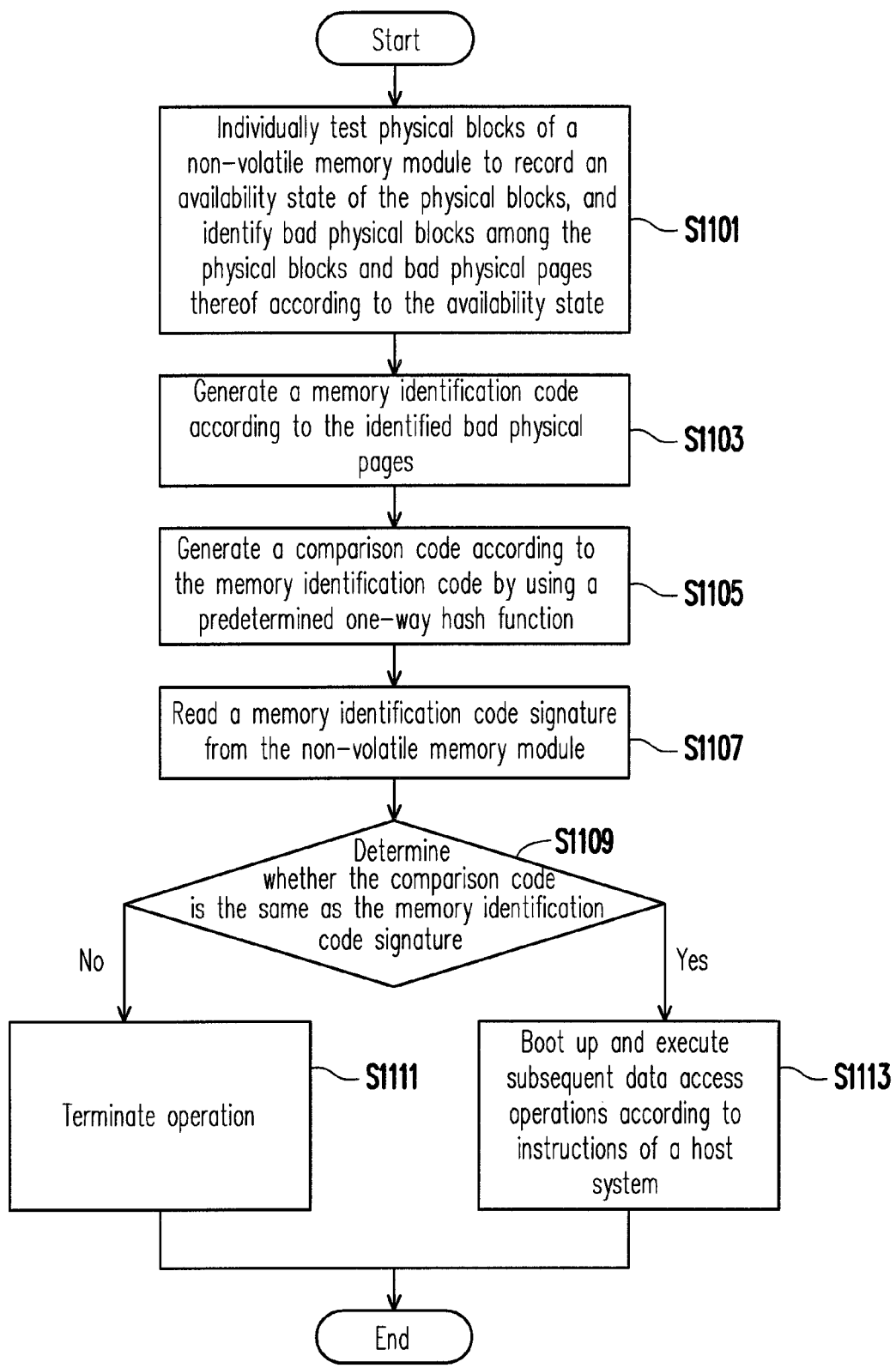
FIG. 11 is a flowchart of a memory management method according to the second exemplary embodiment of the present invention.

FIG. 11 is a flowchart of a memory management method according to the second exemplary embodiment of the present invention.

Referring to FIG. 11, in step S1101, the memory management circuit 202 individually tests the physical blocks 304(0)-304(R) to record the availability state of the physical blocks 304(0)-304(R) and identifies bad physical blocks among the physical blocks 304(0)-304(R) and the bad physical pages thereof according to the availability state. In step S1103, the memory management circuit 202 generates a memory identification code according to the identified bad physical pages. The method for generating the memory identification code has been described above with reference to FIGS. 8-10 therefore will not be described herein.

Next, in step S1105, the memory management circuit 202 generates a comparison code according to the memory identification code by using a predetermined one-way hash function. Then, in step S1107, the memory management circuit 202 reads a memory identification code signature from the non-volatile memory module 106. In step S1109, the memory management circuit 202 determines whether the comparison code is the same as the memory identification code signature.

If the comparison code is different from the memory identification code signature, in step S1111, the memory management circuit 202 terminates its operation. That is, in S1111, the memory management circuit 202 will not execute any command from the host system 1000.

If the comparison code is the same as the memory identification code signature, in step S1113, the memory management circuit 202 starts up and executes subsequent access operations according to instructions of the host system 1000.

Third Exemplary Embodiment

Figure 12:
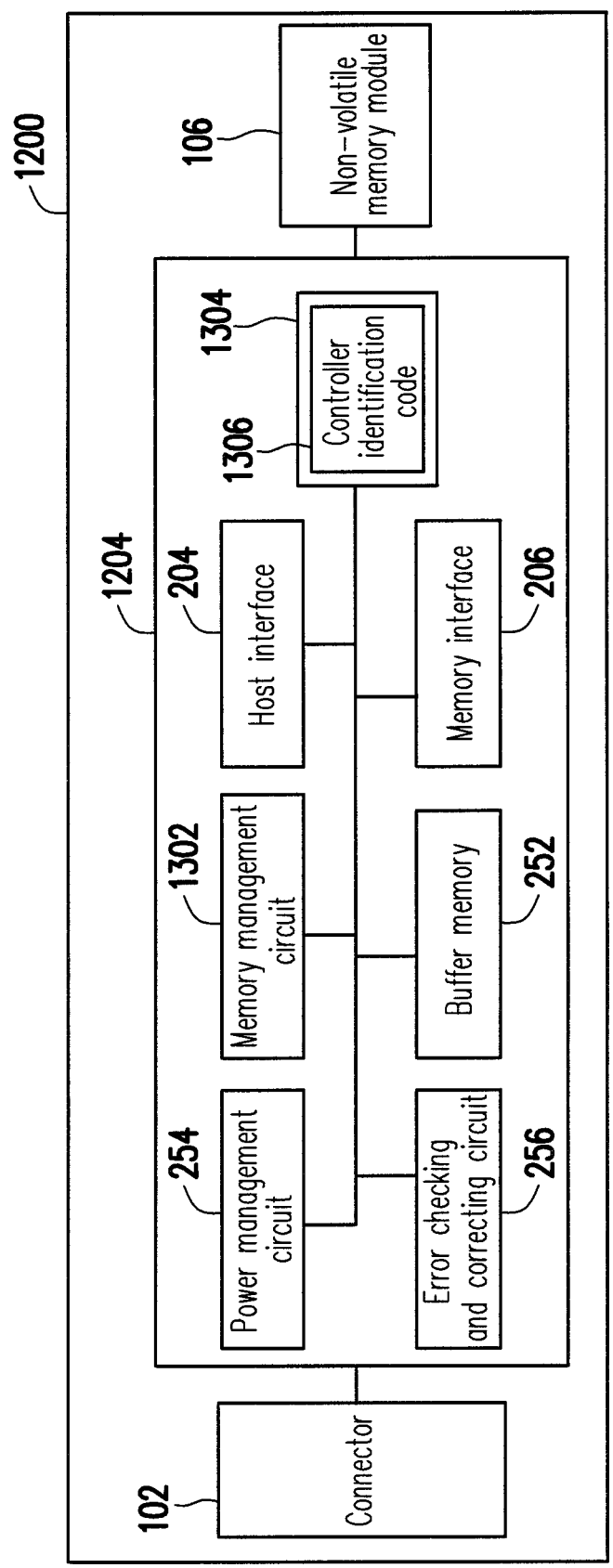
FIG. 12 is a schematic block diagram of a memory storage device according to a third exemplary embodiment of the present invention.

FIG. 12 is a schematic block diagram of a memory storage device according to the third exemplary embodiment of the present invention.

Referring to FIG. 12, the memory storage device 1200 includes a connector 102, a memory controller 1204, and a non-volatile memory module 106. The structures and functions of the connector 102 and the non-volatile memory module 106 have been described above in detail therefore will not be described herein.

The memory controller 1204 executes a plurality of logic gates or control instructions implemented in a hardware form or a firmware form, and the memory controller 1204 performs various data operations (for example, writing, reading, and erasing, etc) in the non-volatile memory module 106 according to instructions of the host system 1000. In the present exemplary embodiment, the memory controller 1204 encrypts/decrypts the data to be written or read according to a controller identification code. Below, the memory management method in the third exemplary embodiment of the present invention will be described in detail with reference to accompanying drawings.

The memory controller 1204 includes a memory management circuit 1302, a host interface 204, a memory interface 206, a ROM 1304, a buffer memory 252, a power management circuit 254, and an error checking and correcting circuit 256. The structures and functions of the host interface 204, the memory interface 206, the buffer memory 252, the power management circuit 254, and the error checking and correcting circuit 256 have been described above in detail therefore will not be described herein.

The memory management circuit 1302 controls the operation of the memory controller 1204. To be specific, the memory management circuit 1302 has a plurality of control instructions. When the memory storage device 1200 is in operation, the control instructions are executed to perform data writing and reading operations on the non-volatile memory module 106 through the memory management method in the present exemplary embodiment.

In the present exemplary embodiment, the control instructions of the memory management circuit 1302 are implemented in a firmware form. For example, the memory management circuit 1302 has a microprocessor unit (not shown) and a ROM (not shown), and the control instructions are burnt into the ROM. When the memory storage device 1200 is in operation, the control instructions are executed by the microprocessor unit to accomplish the memory management method according to the third exemplary embodiment of the present invention.

In another exemplary embodiment of the present invention, the control instructions of the memory management circuit 1302 may also be stored in a specific area (for example, the system area of a memory module exclusively used for storing system data) of the non-volatile memory module 106 as program codes. The memory management circuit 1302 may also have a microprocessor unit (not shown), a ROM (not shown), and a RAM (not shown). In particular, the ROM has a driving code segment. When the memory controller 1204 is enabled, the microprocessor unit first executes the driving code segment to load the control instructions from the non-volatile memory module 106 into the RAM of the memory management circuit 1302. After that, the microprocessor unit runs the control instructions to execute the memory management method according to the third exemplary embodiment of the present invention. Additionally, in another exemplary embodiment of the present invention, the control instructions of the memory management circuit 1302 may also be implemented in a hardware form.

The ROM 1304 is coupled to the memory management circuit 1302 and configured to store a controller identification code 1306. The controller identification code 1306 is a serial number or a random number assigned by the manufacturer of the memory controller 1204.

Figure 13A:
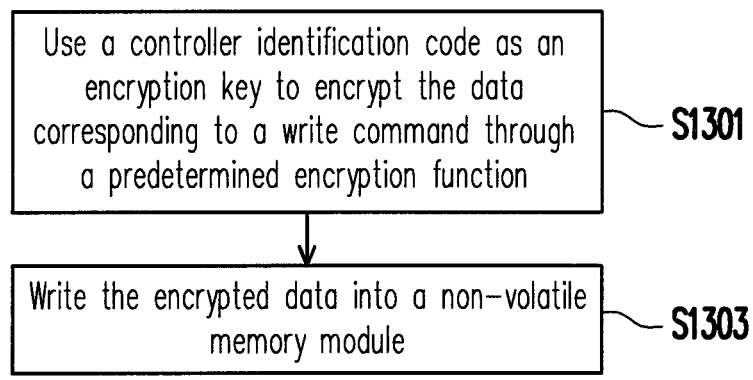
FIG. 13A and FIG. 13B are flowcharts of an access method according to the third exemplary embodiment of the present invention.
Figure 13B:
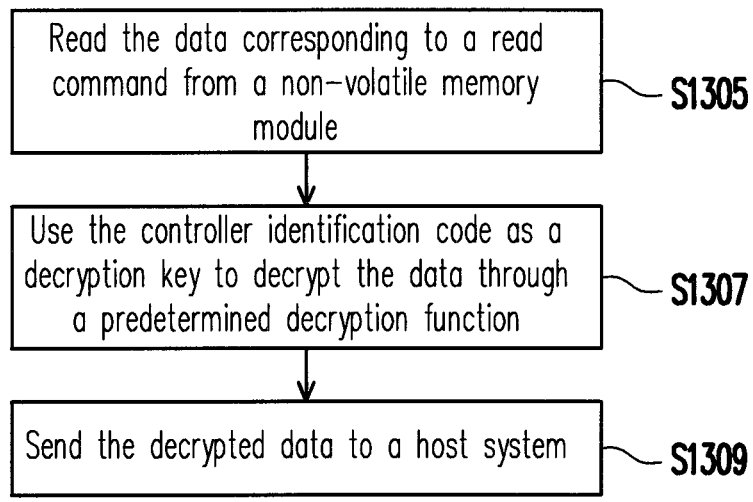

FIG. 13A and FIG. 13B are flowcharts of an access method according to the third exemplary embodiment of the present invention.

Referring to FIG. 13A, when the memory storage device 1200 receives a write command from the host system 1000, in step S1301, the memory management circuit 1302 uses the controller identification code 1306 as an encryption key to encrypt the data corresponding to the write command through a predetermined encryption function. In step S1303, the memory management circuit 1302 writes the encrypted data into the non-volatile memory module 106. Namely, the data to be protected is encrypted and then stored into the non-volatile memory module 106.

Referring to FIG. 13B, when the memory storage device 1200 receives a read command from the host system 1000, in step S1305, the memory management circuit 1302 reads the data corresponding to the read command from the non-volatile memory module 106. After that, in step S1307, the memory management circuit 1302 uses the controller identification code 1306 as a decryption key to decrypt the data through a predetermined decryption function. In step S1309, the memory management circuit 1302 sends the decrypted data to the host system 1000.

In summary, exemplary embodiments of the present invention provide an identification code generation method and a memory management method, wherein a corresponding identification code is recognized according to the characteristic of a non-volatile memory module so that the identification code stored in the non-volatile memory module can be protected from being stolen by a hacker. In addition, according to an exemplary embodiment of the present invention, a memory controller authenticates a non-volatile memory module according to the identification code generated according to the characteristic of the non-volatile memory module, so that the non-volatile memory module in a memory storage device is prevented from being replaced. Moreover, according to an exemplary embodiment of the present invention, the memory controller encrypts/decrypts the digital data stored therein according to a controller identification code and/or the memory identification code, so that the digital data is prevented from being misappropriated by any unauthorized user. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory management method, for generating a memory identification code corresponding to a non-volatile memory module, wherein the non-volatile memory module has a plurality of physical blocks, the memory management method comprising:

testing the physical blocks to obtain a availability state and identifying a plurality of good physical blocks among the physical blocks according to the availability state;

generating the memory identification code corresponding to the non-volatile memory module according to the good physical blocks, wherein the memory identification code corresponding to the non-volatile memory module has a plurality of bits respectively corresponding to the physical blocks, values of the bits corresponding the good physical blocks among the physical blocks are marked as a first value and values of the bits corresponding another physical blocks among the physical blocks are marked as a second value;

generating a memory identification code signature corresponding to the non-volatile memory module according to the memory identification code by using a one-way hash function;

storing the memory identification code signature into the non-volatile memory module;

generating a comparison code according to the memory identification code by using a one-way hash function;

reading the memory identification code signature from the non-volatile memory module;

determining whether the comparison code is the same as the memory identification code signature; and terminating any operation to be performed on the non-volatile memory module when the comparison code is not the same as the memory identification code signature.

2. The memory management method according to claim 1, wherein the step of testing the physical blocks to obtain the availability state and identifying the good physical blocks among the physical blocks according to the availability state comprises:

reading a physical block management table to identify a part of the physical blocks; and testing the part of the physical blocks to obtain the availability state and identifying the good physical blocks among the physical blocks according to the availability state.

3. The memory management method according to claim 1, wherein the step of generating the memory identification code signature corresponding to the non-volatile memory module according to the memory identification code by using the one-way hash function comprises:

generating the memory identification code signature corresponding to the non-volatile memory module according to a controller identification code of a memory controller and the memory identification code by using the one-way hash function.

4. A memory controller, for managing a non-volatile memory module, wherein the non-volatile memory module has a plurality of physical blocks, the memory controller comprising:

a host interface, configured to couple to a host system;

a memory interface, configured to couple to the non-volatile memory module; and a memory management circuit, coupled to the host interface and the memory interface, wherein the memory management circuit is configured to:

test the physical blocks to obtain an availability state and identifying a plurality of good physical blocks among the physical blocks according to the availability state;

generate a memory identification code corresponding to the non-volatile memory module according to the good physical blocks, wherein the memory identification code corresponding to the non-volatile memory module has a plurality of bits respectively corresponding to the physical blocks, values of the bits corresponding the good physical blocks among the physical blocks are marked as a first value and values of the bits corresponding another physical blocks among the physical blocks are marked as a second value;

generate a memory identification code signature corresponding to the non-volatile memory module according to the memory identification code by using a one-way hash function and store the memory identification code signature in the non-volatile memory module;

read the memory identification code signature from the non-volatile memory module;

determine whether the comparison code is the same as the memory identification code signature; and terminate any operation to be performed on the non-volatile memory module when the comparison code is not the same as the memory identification code signature.

5. The memory controller according to claim 4, wherein the procedure of testing the physical blocks to obtain the availability state and identifying the good physical blocks among the physical blocks according to the availability state executed by the memory management circuit comprises:

reading a physical block management table to identify a part of the physical blocks; and testing the part of the physical blocks to obtain the availability state and identifying the good physical blocks among the physical blocks according to the availability state.

6. The memory controller according to claim 4, wherein the memory management circuit is further configured to generate the memory identification code signature corresponding to the non-volatile memory module according to a controller identification code of the memory controller and the memory identification code by using the one-way hash function.

7. A memory management method, for generating a memory identification code corresponding to a non-volatile memory module, wherein the non-volatile memory module has a plurality of physical blocks, the identification code generation method comprising:

testing the physical blocks to obtain an availability state and identifying one or more bad physical blocks among the physical blocks according to the availability state, wherein each of the bad physical blocks has one or more bad physical pages;

generating the memory identification code corresponding to the non-volatile memory module according to the bad physical pages, wherein the memory identification code corresponding to the non-volatile memory module has a plurality of bits respectively corresponding to the physical blocks, values of the bits corresponding the bad physical blocks among the physical blocks are marked as a first value and values of the bits corresponding another physical blocks among the physical blocks are marked as a second value;

generating a memory identification code signature corresponding to the non-volatile memory module according to the memory identification code by using a one-way hash function;

storing the memory identification code signature in the non-volatile memory module;

generating a comparison code according to the memory identification code by using a one-way hash function;

reading the memory identification code signature from the non-volatile memory module;

determining whether the comparison code is the same as the memory identification code signature; and terminating any operation to be performed on the non-volatile memory module when the comparison code is not the same as the memory identification code signature.

8. The memory management method according to claim 7, wherein the step of generating the memory identification code signature corresponding to the non-volatile memory module according to the memory identification code by using the one-way hash function comprises:

generating the memory identification code signature corresponding to the non-volatile memory module according to a controller identification code of a memory controller and the memory identification code by using the one-way hash function.

9. A memory storage system, comprising:

a connector, configured to couple to a host system;

a non-volatile memory module, having a plurality of physical blocks; and a memory controller, coupled to the connector and the non-volatile memory module, wherein the memory controller is configured to:

test the physical blocks to obtain an availability state and identifying one or more bad physical blocks among the physical blocks according to the availability state, wherein each of the bad physical blocks has one or more bad physical pages;

generate a memory identification code corresponding to the non-volatile memory module according to the bad physical pages, wherein the memory identification code corresponding to the non-volatile memory module has a plurality of bits respectively corresponding to the physical blocks, values of the bits corresponding the bad physical blocks among the physical blocks are marked as a first value and values of the bits corresponding another physical blocks among the physical blocks are marked as a second value;

generate a memory identification code signature corresponding to the non-volatile memory module according to the memory identification code by using a one-way hash function and stores the memory identification code signature in the non-volatile memory module;

read the memory identification code signature from the non-volatile memory module;

determine whether the comparison code is the same as the memory identification code signature; and terminate any operation to be performed on the non-volatile memory module when the comparison code is not the same as the memory identification code signature.

10. The memory storage system according to claim 9, wherein the memory controller is further configured to generate the memory identification code signature corresponding to the non-volatile memory module according to a controller identification code and the memory identification code by using the one-way hash function.

11. A memory management method, for a non-volatile memory module, wherein the non-volatile memory module has a plurality of physical blocks and stores a memory identification code signature, the memory management method comprising:

checking an availability state of the physical blocks and generating a memory identification code corresponding to the non-volatile memory module according to the availability state of the physical blocks, wherein the memory identification code corresponding to the non-volatile memory module has a plurality of bits respectively corresponding to the physical blocks, values of the bits corresponding the availability state of the physical blocks among the physical blocks are marked as a first value and values of the bits corresponding another physical blocks among the physical blocks are marked as a second value;

generating a comparison code according to the memory identification code by using a one-way hash function;

reading the memory identification code signature from the non-volatile memory module;

determining whether the comparison code is the same as the memory identification code signature; and terminating any operation to be performed on the non-volatile memory module when the comparison code is not the same as the memory identification code signature.

12. The memory management method according to claim 11, wherein the step of checking the availability state of the physical blocks and generating the memory identification code corresponding to the non-volatile memory module according to the availability state of the physical blocks comprises:

testing the physical blocks to obtain the availability state and identifying a plurality of good physical blocks among the physical blocks according to the availability state; and generating the memory identification code corresponding to the non-volatile memory module according to the good physical blocks.

13. The memory management method according to claim 11, wherein the step of checking the availability state of the physical blocks and generating the memory identification code corresponding to the non-volatile memory module according to the availability state of the physical blocks comprises:

testing the physical blocks to obtain the availability state and identifying one or more bad physical blocks among the physical blocks according to the availability state, wherein each of the bad physical blocks has one or more bad physical pages; and generating the memory identification code corresponding to the non-volatile memory module according to the bad physical pages.

14. The memory management method according to claim 11, wherein the step of generating the comparison code according to the memory identification code by using the one-way hash function comprises:

generating the comparison code according to a controller identification code of a memory controller and the memory identification code by using the one-way hash function.

15. The memory management method according to claim 11 further comprising:

encrypting data by using the memory identification code as an encryption key; and writing the encrypted data into the non-volatile memory module.

16. The memory management method according to claim 11 further comprising:

reading data from the non-volatile memory module; and decrypting the data by using the memory identification code as a decryption key.

* * * * *